(12) United States Patent
Chang et al.

(10) Patent No.: US 8,525,324 B2
(45) Date of Patent: Sep. 3, 2013

(54) SEMICONDUCTOR PACKAGE AND METHOD OF FABRICATING THE SAME

(75) Inventors: Hong-Da Chang, Taichung Hsien (TW); Hsin-Yi Liao, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/542,026

(22) Filed: Jul. 5, 2012

(65) Prior Publication Data

US 2013/0075888 A1 Mar. 28, 2013

(30) Foreign Application Priority Data

Sep. 22, 2011 (TW) .............................. 100134079 A

(51) Int. Cl.
*H01L 23/04* (2006.01)
*H01L 21/50* (2006.01)

(52) U.S. Cl.
USPC .......................................................... 257/704

(58) Field of Classification Search
USPC .. 257/686, 685, 723, 726, E25.031–E25.032, 257/E23.042, 100, 433, 434, 667, 787–796, 257/E29.324, E31.117–E31.118, E51.02, 257/E23.11–E23.14, 678–733, E21.502–E21.504; 438/15, 25, 26, 51, 55, 64–67, 112, 124, 438/126, 127, 6, 28, 107, 109, 406, 455–459
See application file for complete search history.

(56) References Cited

U.S. PATENT DOCUMENTS

| | | | | |
|---|---|---|---|---|
| 6,710,454 | B1* | 3/2004 | Boon | 257/777 |
| 7,321,163 | B2* | 1/2008 | Terui | 257/686 |
| 7,322,239 | B2* | 1/2008 | Kurogi | 73/514.01 |
| 7,423,336 | B2* | 9/2008 | Corisis et al. | 257/686 |
| 2008/0157339 | A1* | 7/2008 | O Suilleabhain et al. | 257/690 |
| 2008/0178463 | A1* | 7/2008 | Okubora | 29/830 |

* cited by examiner

*Primary Examiner* — Dao H Nguyen
*Assistant Examiner* — Tram H Nguyen
(74) *Attorney, Agent, or Firm* — Edwards Wildman Palmer LLP; Peter F. Corless; Steven M. Jensen

(57) ABSTRACT

A semiconductor package is provided, which includes: a micro electro mechanical system (MEMS) chip; a cap provided on the MEMS chip; an electronic element provided on the cap including a plurality of first conductive pads and second conductive pads; a plurality of first conductive elements electrically connected to the first conductive pads and the MEMS chip; a plurality of second conductive elements formed on the second conductive pads, respectively; and an encapsulant formed on the MEMS chip covering the cap, the electronic element, the first conductive elements and the second conductive elements, with the second conductive elements being exposed from the encapsulant. Thus, the size of the semiconductor package is reduced. A method of fabricating the semiconductor package is also disclosed.

18 Claims, 4 Drawing Sheets

SEMICONDUCTOR PACKAGE AND METHOD OF FABRICATING THE SAME

CROSS-REFERENCES TO RELATED APPLICATIONS

This application claims under 35 U.S.C. §119(a) the benefit of Taiwanese Application No. 100134079, filed Sep. 22, 2011, the entire contents of which is incorporated herein by reference.

FIELD OF THE INVENTION

The present invention relates to semiconductor packages and methods of fabricating the same, and, more particularly, to a semiconductor package having MEMS elements and a method of fabricating the same.

BACKGROUND OF THE INVENTION

With the rapid development of semiconductor processes, low-profiled and compact-sized electronic components come to the market. Recently, it is popular in the art to integrate various mechanical components with electronic components to produce a nanometer scale product. Therefore, a micro electro mechanical system (MEMS) is developed, which involves manufacturing traditional mechanical components using a patterning method (such as exposure, development, etching, etc.) of the semiconductor manufacturing process to obtain miniaturized components. With these components converting environmental signals to electrical signals, signals are obtained by electrical conversion. These components are, for example, pressure sensors, flow sensors, accelerometers, gyroscopes, etc. MEMS has been widely applied in many fields, such as medical, automotive, mobile, global satellite positioning system (GPS) and so on. MEMS is a science that integrates electronic, electrical, mechanical, materials, chemical and other fields of knowledge that carries out a variety of microfabrication techniques using existing semiconductor technologies. MEMS elements can be provided on a chip surface, and encapsulated by a protective mask or underfill material, thereby achieving a MEMS structure. MEMS is also applicable in optoelectronics, communications and biotechnology fields. The miniaturization of electronic components significantly reduces the size of the electronic components, improves system efficiency, and reduces production costs. However, in contrast to the traditional semiconductor chips, surface components of the MEMS chip are easy to damage by environmential influence to cause reliability problem, so the cost of the MEMS package is about 50 to 95% of the overall production cost, thus the packaging of MEMS elements has become a technical bottleneck. With the current demand for miniaturization of electronic products, there is an urgent need for a package structure with a significantly reduced size.

Referring to FIG. 1, a cross-section view of a traditional semiconductor package 1 is provided. The semiconductor package 1 includes an MEMS chip 10, a cap 12, a semiconductor chip 14, an encapsulant 18 and a substrate 16. The cap 12 encapsulates the MEMS chip 10 to protect MEMS chip 10 from moisture, dust and other external environmental factors. A first wire 11a electrically connects a conductive pad 102 of the MEMS chip 10 and a first conductive pad 142 of the semiconductor chip 14. A second wire 11b electrically connects a second conductive pad 144 of the semiconductor chip 14 and a solder pad 162 of the substrate 16. However, the MEMS chip 10 and the semiconductor chip 14 are arranged side by side on the substrate 16, such that the volume of the encapsulant 18 cannot be reduced or meets the low-profile and compact-size requirements.

Therefore, how to overcome the shortcomings of the prior art is an important issue.

SUMMARY OF THE INVENTION

In the light of forgoing drawbacks, the present invention provides a semiconductor package, comprising: a micro electro mechanical system (MEMS) chip; a cap provided on the MEMS chip; an electronic element provided on the cap including a plurality of first conductive pads and second conductive pads; a plurality of first conductive elements electrically connected to the first conductive pads and the MEMS chip; a plurality of second conductive elements formed on the second conductive pads, respectively; and an encapsulant encapsulating the MEMS chip, the cap, the electronic element, the first conductive elements and the second conductive elements, with the second conductive elements being exposed from the encapsulant.

The present invention further provides a method of fabricating a semiconductor package, comprising: providing a substrate having at least one micro electro mechanical system (MEMS) element, and a cap disposed on the substrate covering the MEMS element; providing an electronic element including a plurality of first conductive pads and second conductive pads on the cap; electrically connecting the first conductive pads and the substrate by a plurality of first conductive elements, and disposing a plurality of second conductive elements on the second conductive pads, respectively; and forming an encapsulant on the substrate encapsulating the cap, the electronic element, the first conductive elements and the second conductive elements, with the second conductive elements being exposed from the encapsulant.

It can be seen from the above that the semiconductor package of the present invention is obtained by stacking, that is, forming the electronic element on the cap, forming the first conductive pads and the second conductive pads on the electronic element, and forming the first conductive elements on the first conductive pads and electrically connecting the MEMS chip. In addition, the second conductive elements are formed on the second conductive pads and exposed from the encapsulant. Thus, the semiconductor package of the present invention is a highly integrated package, not only the size of the semiconductor package is reduced, but also utilization per unit area is increased.

DETAILED DESCRIPTION OF THE EMBODIMENTS

The present invention is described by the following specific embodiments. Those with ordinary skill in the art can readily understand the other advantages and functions of the present invention after reading the disclosure of this specification.

It should be noted that structures, ratios, sizes shown in the attached drawings should be read in conjunction with the disclosure in order to facilitate the understanding of those skill in the art, and in no way limit the conditions implementable by the present invention, thus they have no technical meanings. Modifications to the structures, ratios and sizes are all within the range of the disclosure as long as they do not affect the effects generated and objects achieved by the present invention. Meanwhile, terms, such as "above," "two," "one" or "a," appearing in the specification are to facilitate understanding of the descriptions and not to limit the scope of the present invention.

First Embodiment

A semiconductor package and a method of fabricating the same disclosed by the present invention are described in details in conjunction with FIGS. 2A to 2F.

Figure 1:
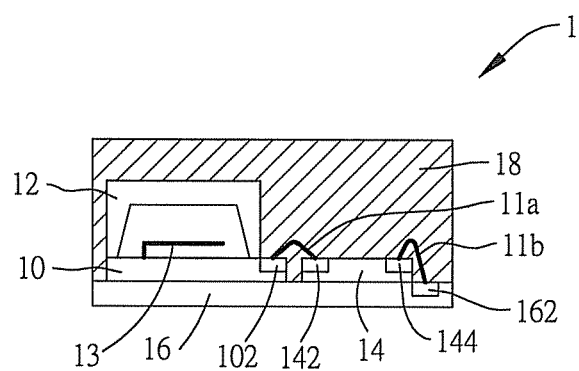
FIG. 1 is a cross-sectional view of a traditional semiconductor package.
Figure 2A:
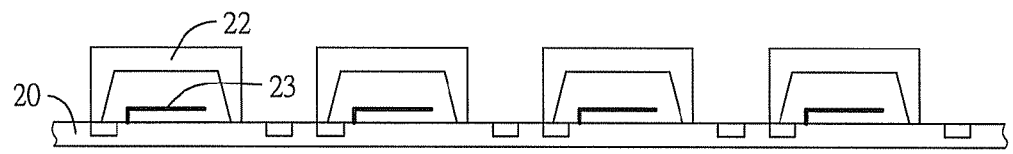
FIGS. 2A to 2F are schematic diagrams illustrating a method of fabricating a semiconductor package according to a first embodiment of the present invention, wherein FIG. 2E' illustrates the formation of a circuit layer, and FIG. 2F' illustrates an electronic element that is not displaced and extends beyond the cap.

As shown in FIG. 2A, a substrate 20 with a plurality of micro electro mechanical system (MEMS) element 23 is provided. A cap 22 is provided on the substrate 20 for covering the MEMS element 23. The cap 22 can be made of, but not limited to, glass, silicon, metal, ceramic or epoxy resin. The cap 22 can be bonded to the substrate 20 via an adhesive, such as glass frit or resin, or by anodic bonding, eutectic bonding, or silicon fusion bonding techniques. After the cap is bonded, the cavity of the cap can be vacuumed to stay in a hermeticity or non-hermeticity state.

Figure 2B:
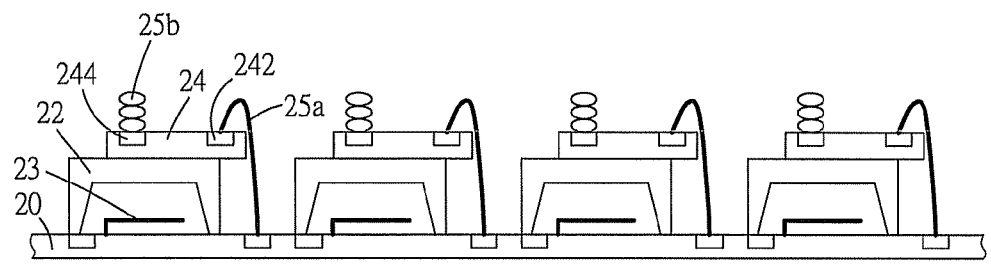

As shown in FIG. 2B, an electronic element, such as, but not limited to a semiconductor chip 24, is provided on the cap 22 in a staggered manner with respect to the cap 22. In another embodiment, an active element, a passive element or other electronic elements may be provided on the cap 22. The semiconductor chip 24 has a plurality of first conductive pads 242 and second conductive pads 244. First conductive elements 25a and second conductive elements 25b are then formed on the first conductive pads 242 and the second conductive pads 244, respectively. The first conductive elements 25a are electrically connected to the substrate 20. In an embodiment, the second conductive elements 25b are solder such as a plurality of stacked conductive elements that are mounted onto the second conductive pads 244 by a ball placement device. In an embodiment, the second conductive elements 25b may also be a single large-sized solder ball. In another embodiment, the second conductive elements 25b can be formed by screen printing a solder paste onto the second conductive pads 244. In yet another embodiment, the second conductive elements 25b can be formed on the second conductive pads 244 as a plurality of metal stud bumps by a wire bonder, and the overall height is less than 100 µm.

Figure 2C:
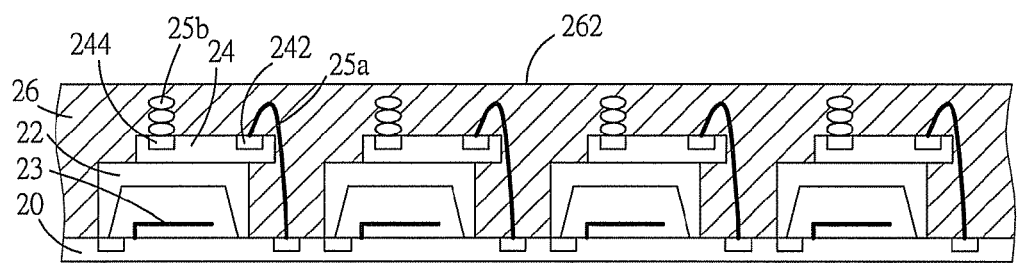
Figure 2D:
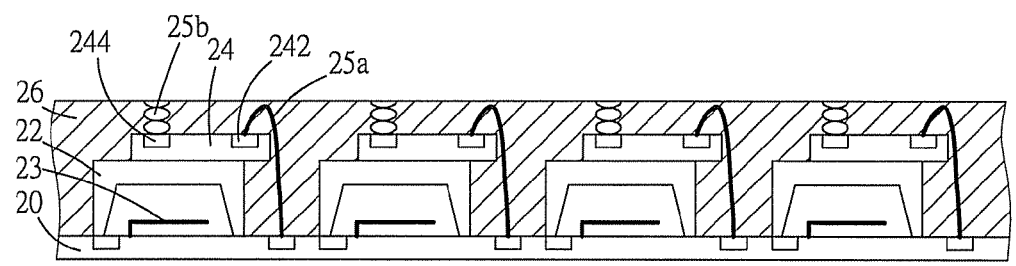

As shown in FIGS. 2C and 2D, an encapsulant 26 is formed on the substrate 20 to encapsulate the cap 22, the semiconductor chip 24, the first conductive elements 25a and the second conductive elements 25b. Portions of the second conductive elements 25b are exposed from the encapsulant 26. For example, the top surface 262 of the encapsulant 26 can be grinded to expose the second conductive elements 25b. Hygroscopic agent can be included in the encapsulant 26 to absorb the moisture in the package structure, thus increasing the reliability of the package. The encapsulant 26 can be silicone resin, epoxy film, dry film, powder epoxy, liquid resin, or other objects that achieve the same effects. The encapsulant 26 is formed by transfer molding, compression molding or dispensing techniques. During the molding process, the mold can have a thermal release film to prevent the resin from being adhered to the mold.

Figure 2E:
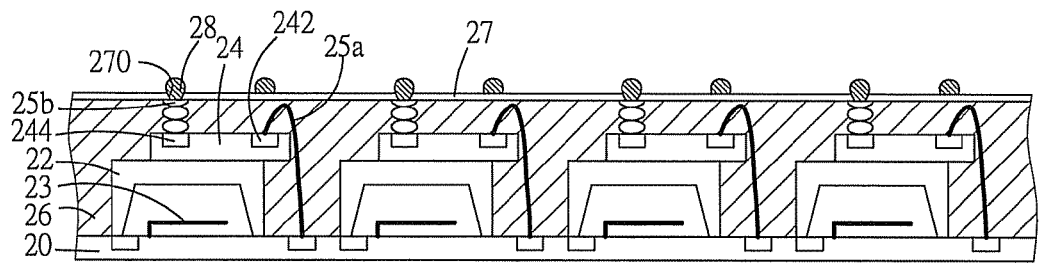
Figure 2E:
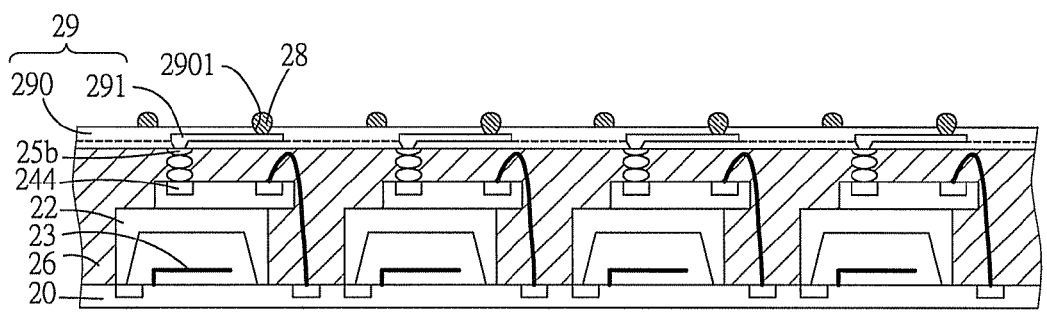

As shown in FIG. 2E, a solder resist layer 27 is formed on the encapsulant 26. The solder resist layer 27 has openings 270 for the second conductive elements 25b to be exposed therefrom. Conductive elements 28 are mounted in the openings 270 to electrically connect with the second conductive elements 25b.

FIG. 2E' shows another embodiment. A circuit layer 29 is formed on the encapsulant 26. The circuit layer 29 includes a dielectric layer 290 and a circuit 291 formed in the dielectric layer 290 and electrically connected to the second conductive elements 25b. The dielectric layer 290 has dielectric openings 2901 for portions of the circuit 291 to be exposed therefrom. The dielectric layer can have a double-layered structure that includes a first dielectric layer and a second dielectric layer. The first dielectric layer can be overlaid on the encapsulant 26. In an embodiment, the first dielectric layer can be polyimide (PI), Bis-Benzo-Cyclo-Butene (BCB), a solder mask, ink, or other materials. After the first dielectric layer is formed, openings corresponding to the second conductive elements 25b are formed in the first dielectric layer to expose the second conductive elements 25b, and then the patterned circuit 291 is formed on the first dielectric layer and electrically connected to the second conductive elements 25b. Then, a second dielectric layer is overlaid on the patterned circuit 291, and dielectric openings 2901 are formed to expose portions of the circuit 291, thus forming pads. In an embodiment, the material of the second dielectric layer can be BCB, polyimide (PI), solder mask, ink, or other materials. Thereafter, conductive elements 28 are mounted on the pads in the dielectric openings 2901 by a ball placement device. In another embodiment, conductive elements can be formed by screen printing and reflow of a solder paste, or bumps can be formed by electroplating. In another embodiment, bumps can be formed by a wiring bonder. In another embodiment, the conductive elements 28 can be wired pins.

Figure 2F:
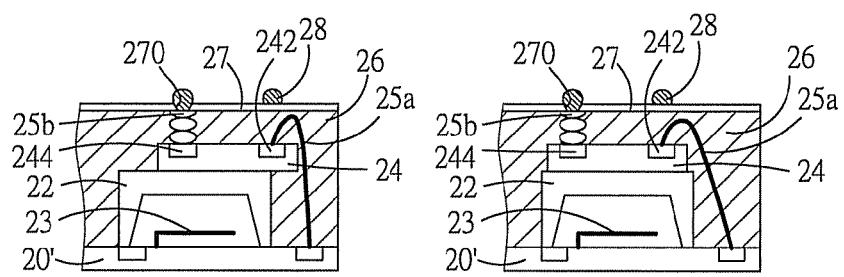

As shown in FIG. 2F, a singulation process is performed to the encapsulant 26 and form a plurality of individual semiconductor packages. In other words, the substrate 20 is singulated into a plurality of MEMS chips 20'. Each of the MEMS chips 20' has MEMS elements.

Furthermore, the structure shown in FIG. 2F is similar to the semiconductor package disclosed in FIG. 2F, and the difference is that the semiconductor chip 24 is displaced on the cap 22, and the side of the semiconductor chip 24 is not extending out of the side of the cap 24.

Second Embodiment

Figure 3A:
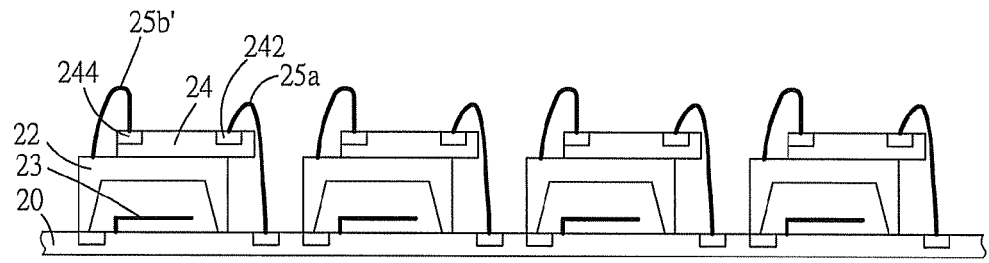
FIGS. 3A to 3C are schematic diagrams illustrating a method of fabricating a semiconductor package according to a second embodiment of the present invention.
Figure 3B:
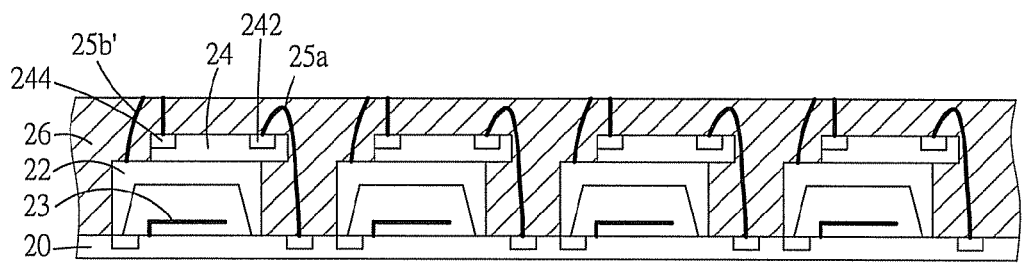
Figure 3C:
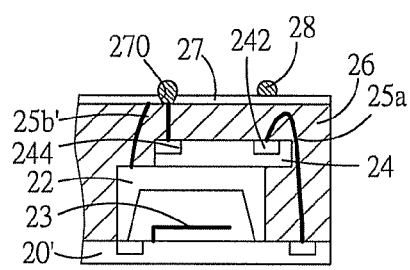

Referring to FIG. 3A to 3C, a method of fabricating a semiconductor package according to a second embodiment of the present invention is provided. This embodiment shows that the second conductive elements are bonding wires.

As shown in FIG. 3A, which is a continuation of FIG. 2B, second conductive elements 25b' such as bonding wires are formed on the second conductive pads 244. One end of each of the bonding wires is attached to the cap 22. The bonding wires are connected to the second conductive pads 244 by the wire bonder, and then vertically stretched to a height less than about 100 µm, and connected to the cap 22. The vertically stretched height of the bonding wires are determined by various implementations, but the overall height is less than 100 µm.

As shown in FIG. 3B, the encapsulant 26 is formed on the substrate 20, with the second conductive elements 25b' being exposed therefrom. The bonding wires and a portion of the bonding wires exposed from the encapsulant 26 are truncated via a grinding technique.

As shown in FIG. 3C, after the conductive elements 28 are mounted, the encapsulant 26 is cut to obtain a plurality of individual semiconductor packages. Preferably, the packages is 1-1.2 times wider than the MEMS chips 20'.

Figure 4:
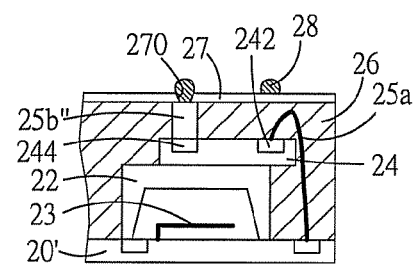
FIG. 4 is schematic diagram illustrating a semiconductor package according to a third embodiment of the present invention.

Referring to FIG. 4, a semiconductor package according to a third embodiment of the present invention is provided. The third embodiment differs from the first embodiment only in that the second conductive elements 25b" are metal pillars.

According to the above mentioned method, the present invention further provides a semiconductor package, including: an MEMS chip 20'; a cap 22 provided on the MEMS chip 20', an electronic element such as a semiconductor chip 24 arranged on the cap 22, wherein the semiconductor chip 24 has a plurality of first conductive pads 242 and second conductive pads 244; a plurality of first conductive elements 25a disposed on the first conductive pads 242 and electrically connected to the MEMS chip 20'; a plurality of second conductive elements 25b, 25b', 25b" disposed on the second conductive pads 244; and an encapsulant 26 formed on the MEMS chip 20' to encapsulate the cap 22, the semiconductor chip 24, the first conductive elements 25a, and the second conductive elements 25b, 25b', 25b". The second conductive elements 25b, 25b', 25b" are exposed from the encapsulant 26, wherein the semiconductor chip 24 is arranged on the cap 22 in a staggered manner with respect thereto.

The semiconductor package of the present invention may further include a solder resist layer 27 formed on the encapsulant 26. The solder resist layer 27 includes openings 270 corresponding to the exposed second conductive elements 25b, 25b', 25b". Moreover, the semiconductor package further includes conductive elements 28 provided in the openings 270 for electrically connecting the second conductive elements 25b, 25b', 25b".

Alternatively, the semiconductor package includes a circuit layer 29. The circuit layer 29 includes a dielectric layer 290 and a circuit 291 formed in the dielectric layer 290 and electrically connecting the second conductive elements 25b, 25b', 25b". The dielectric layer 290 includes dielectric openings 2901 for exposing portions of the circuit 291. In addition, the semiconductor package further includes conductive elements 28 provided in the dielectric openings 2901.

The first conductive elements 25a are bonding wires, and the second conductive elements 25b, 25b', 25b" are solder, truncated bonding wires, metal studs or metal pillars.

It can be seen from the above that the semiconductor package of the present invention is obtained by stacking, that is, providing the electronic element on the cap, having the first conductive pads and the second conductive pads on the electronic element, and forming the first conductive elements on the first conductive pads and electrically connecting the MEMS chip. In addition, the second conductive elements are formed on the second conductive pads and exposed from the encapsulant.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A semiconductor package, comprising:
    a micro electro mechanical system (MEMS) chip;
    a cap provided on the MEMS chip;
    an electronic element provided on the cap including a plurality of first conductive pads and second conductive pads;
    a plurality of first conductive elements electrically connected to the first conductive pads and the MEMS chip;
    a plurality of second conductive elements disposed on the second conductive pads; and
    an encapsulant encapsulating the MEMS chip, the cap, the electronic element, the first conductive elements and the second conductive elements, and the second conductive elements being exposed from the encapsulant.

2. The semiconductor package of claim 1, further comprising a circuit layer disposed on the encapsulant, and including a plurality of pads.

3. The semiconductor package of claim 2, further comprising conductive elements or pins disposed on the pads of the circuit layer.

4. The semiconductor package of claim 1, wherein the first conductive elements are bonding wires.

5. The semiconductor package of claim 1, wherein the second conductive elements are metal studs, solder, bonding wires or metal pillars.

6. The semiconductor package of claim 1, wherein the electronic element is arranged on the cap in a staggered manner.

7. The semiconductor package of claim 1, wherein the second conductive elements has a height less than 100 µm.

8. The semiconductor package of claim 1, wherein the electronic element is an application specific integrated circuit (ASIC).

9. A method, comprising:
    disposing a cap on a substrate having at least one MEMS element, in a manner that the MEMS element is covered by the cap;
    mounting on the cap an electronic element with a plurality of first conductive pads and second conductive pads;
    electrically connecting the first conductive pads and the substrate by a plurality of first conductive elements, and disposing a plurality of second conductive elements on the second conductive pads; and
    forming an encapsulant on the substrate encapsulating the cap, the electronic element, the first conductive elements and the second conductive elements, with the second conductive elements being exposed from the encapsulant.

10. The method of claim 9, further comprising forming on the encapsulant a circuit layer having a plurality of pads.

11. The method of claim 10, further comprising forming conductive elements or pins on the pads.

12. The method of claim 9, further comprising singulating the substrate to form a plurality of individual semiconductor packages.

13. The method of claim 9, wherein the first conductive elements are bonding wires.

14. The method of claim 9, wherein the second conductive elements are metal studs, solder, bonding wires or metal pillars.

15. The method of claim 9, further comprising grinding a top surface of the encapsulant to expose the second conductive elements from the encapsulant.

16. The method of claim 9, wherein the electronic element is arranged on the cap in a staggered manner.

17. The method of claim 9, wherein the second conductive elements has a height less than 100 µm.

18. The method of claim 9, wherein the electronic element is an application specific integrated circuit (ASIC).

* * * * *